United States Patent
Holder et al.

(10) Patent No.: US 11,056,810 B2
(45) Date of Patent: Jul. 6, 2021

(54) CIRCUIT BOARD WITH A PLUG CONNECTION

(71) Applicant: Marelli Automotive Lighting Reutlingen (Germany) GmbH, Reutlingen (DE)

(72) Inventors: Ulrich Holder, Römerstein (DE); Sinisa Rubil, Pfullingen (DE)

(73) Assignee: Marelli Automotive Lighting Reutlingen (Germany) GmbH, Reutlingen (DE)

( * ) Notice: Subject to any disclaimer, the term of this patent is extended or adjusted under 35 U.S.C. 154(b) by 0 days.

(21) Appl. No.: 15/931,719

(22) Filed: May 14, 2020

(65) Prior Publication Data

US 2020/0366014 A1    Nov. 19, 2020

(30) Foreign Application Priority Data

May 17, 2019   (DE) ...................... 10 2019 113 068.9

(51) Int. Cl.
*H01R 12/71*   (2011.01)
*H01R 12/57*   (2011.01)
*H01R 12/70*   (2011.01)

(52) U.S. Cl.
CPC ........... *H01R 12/716* (2013.01); *H01R 12/57* (2013.01); *H01R 12/707* (2013.01)

(58) Field of Classification Search
CPC .............................. H01R 12/716; H01R 12/57
(Continued)

(56) References Cited

U.S. PATENT DOCUMENTS 4,012,094 A * 3/1977 VanRenssen ........... H01J 29/92
  439/58
4,775,333 A * 10/1988 Grider .................. H01R 12/721
  264/277

(Continued)

FOREIGN PATENT DOCUMENTS

DE         29603390 U1    6/1997
DE      202016105563 U1    2/2017
(Continued)

OTHER PUBLICATIONS

Office Communication for European Patent Application No. 20169307.4 dated Sep. 30, 2020.

*Primary Examiner* — Neil Abrams
(74) *Attorney, Agent, or Firm* — Howard & Howard Attorneys PLLC

(57) ABSTRACT

A circuit board with a plug connection comprises a first plug element and a second plug element. The circuit board has a first side and a second side. The first plug element is mechanically connected to the first side in a contact and attachment region on the first side, and electrically conductively connected to at least one component. The first plug element is mechanically connected to a second plug element. An electrical connection of the second plug element to the first plug element lies entirely within a first interior region delimited by the first side of the circuit board, which is separated by the circuit board from a second interior region delimited by the second side, and that the second side has a region lying opposite the contact and attachment region of the first side in which components are arranged and/or in which the conductor paths run.

12 Claims, 4 Drawing Sheets

(58) Field of Classification Search
USPC .............................. 439/76.1, 76.2; 361/752
See application file for complete search history.

(56) References Cited

U.S. PATENT DOCUMENTS

| | | | | |
|---|---|---|---|---|
| 4,826,442 | A | 5/1989 | Douty et al. | |
| 4,944,684 | A * | 7/1990 | Leibowitz | H01R 31/02 361/792 |
| 4,952,529 | A * | 8/1990 | Grider | H05K 3/3405 29/836 |
| 5,428,535 | A * | 6/1995 | Katsumata | B60R 16/0238 361/641 |
| 5,502,615 | A * | 3/1996 | Kubota | B60K 37/02 361/647 |
| 5,528,093 | A * | 6/1996 | Adam | H02K 5/225 310/239 |
| 5,622,506 | A * | 4/1997 | Hornig | B60R 16/0238 439/540.1 |
| 5,959,521 | A * | 9/1999 | Kohmura | H01F 27/40 336/198 |
| 6,099,325 | A * | 8/2000 | Parkhill | H01R 9/2466 361/707 |
| 6,180,045 | B1 * | 1/2001 | Brandenburg | H05K 7/20854 264/263 |
| 6,244,877 | B1 * | 6/2001 | Asao | H01R 9/2466 361/760 |
| 6,461,195 | B2 * | 10/2002 | Chang | H01R 13/7137 200/51 R |
| 6,511,328 | B2 * | 1/2003 | Molus | H01R 13/741 439/502 |
| 6,652,292 | B2 * | 11/2003 | Pratt | H01R 13/6658 439/620.09 |
| 6,655,975 | B1 * | 12/2003 | Liedtke | H05K 5/064 439/276 |
| 7,149,089 | B2 * | 12/2006 | Blasko | H01R 13/521 361/752 |
| 7,209,367 | B2 * | 4/2007 | Nakano | H05K 3/3405 361/803 |
| 7,396,254 | B2 * | 7/2008 | Harmelink | H01R 13/518 439/540.1 |
| 7,510,405 | B1 * | 3/2009 | Prest | G06F 1/1632 439/638 |
| 7,537,464 | B2 * | 5/2009 | Brandenburg | H01R 4/2404 439/76.1 |
| 7,697,300 | B2 * | 4/2010 | Brandt | H05K 5/0052 361/736 |
| 7,726,980 | B1 * | 6/2010 | Wang | B60Q 1/0088 439/76.1 |
| 7,862,348 | B2 * | 1/2011 | Strauss | H05B 3/06 439/83 |
| 8,172,583 | B2 * | 5/2012 | Friedrich | H01R 9/2466 439/76.1 |
| 8,248,800 | B2 * | 8/2012 | Takata | F16H 61/0006 361/699 |
| 8,430,692 | B2 * | 4/2013 | Peng | H01R 13/518 439/607.46 |
| 8,651,879 | B2 * | 2/2014 | Stiehl | H01R 13/6658 439/76.1 |
| 8,693,205 | B2 * | 4/2014 | Moser | H05K 5/0078 361/752 |
| 8,780,564 | B2 * | 7/2014 | Yanai | B60T 13/686 361/720 |
| 9,101,066 | B2 * | 8/2015 | Azumi | H05K 5/062 |
| 9,320,165 | B2 * | 4/2016 | Gruber | H05K 5/0069 |
| 10,044,122 | B2 * | 8/2018 | Liskow | B60R 16/03 |
| 10,084,253 | B2 * | 9/2018 | Ribas | H01R 12/716 |
| 10,673,160 | B2 | 6/2020 | Baier et al. | |
| 10,756,476 | B2 * | 8/2020 | Koelle | H01R 13/504 |
| 2005/0135073 | A1 * | 6/2005 | Thorum | B60R 16/0239 361/752 |
| 2014/0285985 | A1 * | 9/2014 | Tanaka | H05K 5/0069 361/752 |
| 2018/0102601 | A1 | 4/2018 | Baier et al. | |
| 2020/0366014 | A1 * | 11/2020 | Holder | H01R 12/707 |

FOREIGN PATENT DOCUMENTS

| | | |
|---|---|---|
| EP | 1814199 A2 | 8/2007 |
| EP | 1830432 A2 | 9/2007 |
| EP | 2928022 A1 | 10/2015 |
| JP | 2000077121 A | 3/2000 |

\* cited by examiner

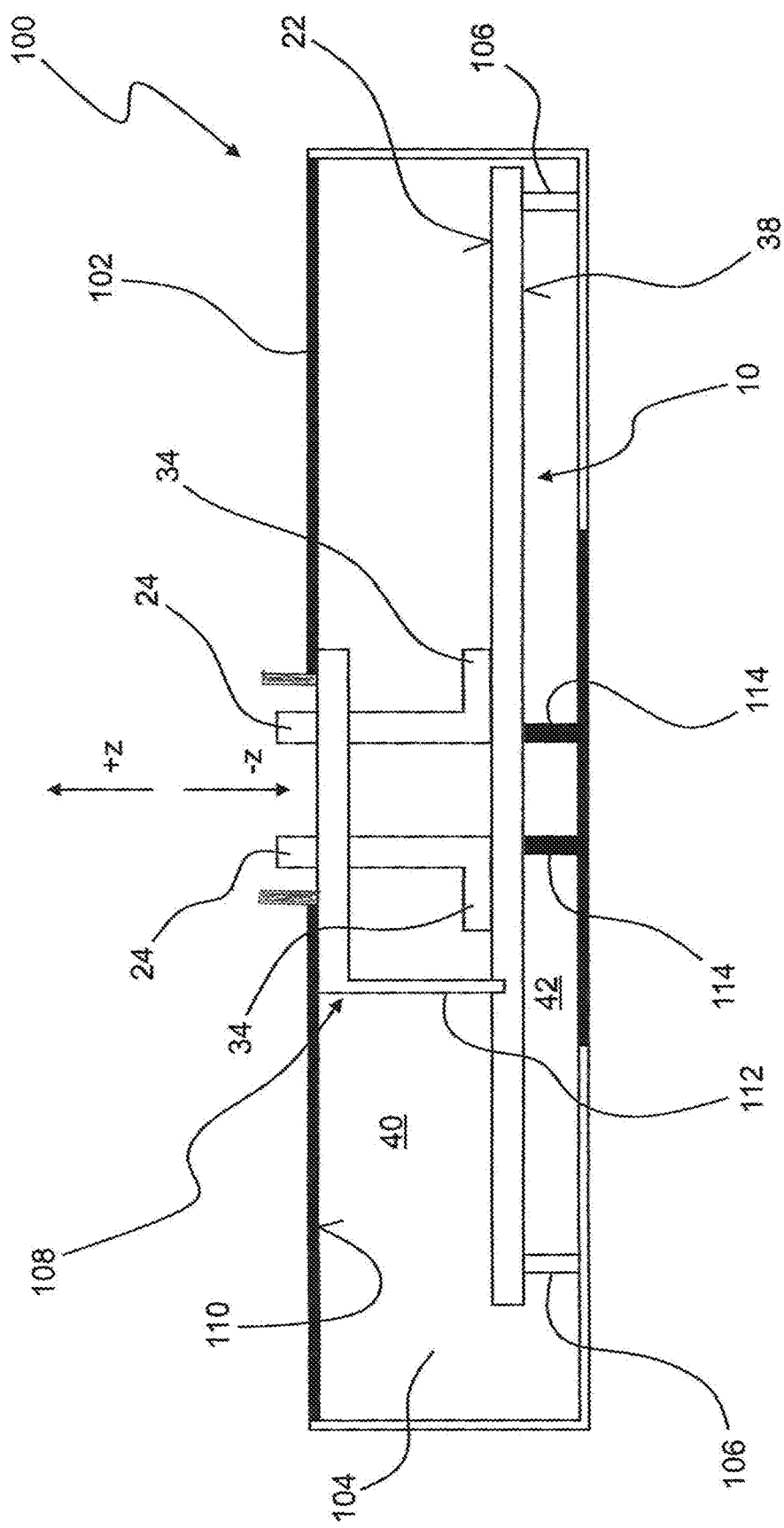

CIRCUIT BOARD WITH A PLUG CONNECTION

CROSS-REFERENCE TO RELATED APPLICATIONS

The present application claims priority to and all the benefits of German Patent Application No. 10 2019 113 068.9, filed on May 17, 2019, which is hereby expressly incorporated herein by reference in its entirety.

BACKGROUND OF THE INVENTION

1. Field of the Invention

The present invention relates to a control unit with a circuit board.

2. Description of the Related Art

Such a control unit is known, e.g. from EP 2 928 022 A1. The circuit board of the known control unit has a first plug element that is configured to be joined with a second plug element to form a plug connection. The circuit board has a first side populated with first components and containing conductor paths, and a second side. The first plug element is securely mechanically connected to the first side of the circuit board in a contact and attachment region of the first side. The contact and attachment region contains first electrical contacts that are electrically conductively connected to at least one of the components through metallic structures on or within the circuit board. The first plug element is configured to be securely mechanically connected to a second plug element, that has second electrical contacts, which then, when the first plug element is securely mechanically connected to the second plug element, are electrically conductively connected to the first electrical contacts.

In the known control unit, the circuit board forms a wall for the control unit. The first side of the circuit board faces an interior space of the control unit. The circuit board has an opening in which the first plug element is located. The first plug element covers the opening and is attached to an edge of the opening on the first side of the circuit board. The attachment is therefore in the interior of the control unit. First electrical contacts extend from the first plug element into the opening. A second plug element, forming an end of a cable harness, can be inserted with second electrical contacts into the opening and mechanically and electrically coupled to the first plug element.

Control units are also known that have circuit boards in which the plug connection is obtained with a plug design known as a "press fit" connection. With this design, the circuit board contains metal sleeves (through connections) that connect the first side of the circuit board with the second side of the circuit board. Metal pins are pressed into these metal sleeves, which then collectively form a first plug element located in a contact and attachment region of the first side.

Because the metal pins extend from both sides of the circuit board when they are in the through connections, the components and/or conductor paths cannot be located in a region corresponding to the contact and attachment region of the first side and the region of the second side lying opposite the contact and attachment region of the first side. This is also the case with a plug element known from U.S. Pat. No. 4,826,442 that has a series of solder tails ("integral solder tails 28" therein), all of which pass through a circuit board ("circuit board 48" therein).

SUMMARY OF THE INVENTION

The present invention differs from this prior art in that electrical connections of the first plug element configured to produce the plug connection lie entirely within a first interior region of the control unit delimited by the first side of the circuit board, which is separated by the circuit board from a second interior region of the control unit delimited by the second side, and that the second side has a region lying opposite the contact and attachment region of the first side, in which electrical components are located and/or in which conductor paths run.

In that the first plug element lies entirely within a first interior region delimited by the first side of the circuit board, which is separated by the circuit board from a second interior region delimited by the second side, it is then possible to locate electrical components and/or run conductor paths in a region of the second side lying opposite the contact and attachment region of the first side.

These features therefore solve the problem of making better use of the surface area of a circuit board. The invention makes it possible to place a specific number of components, which require a specific size of the circuit board and thus the control unit according to the prior art, on a smaller circuit board without sacrificing functionality.

A preferred embodiment of the control unit is distinguished in that the first plug element is securely mechanically connected to the circuit board in the form of an SMD component.

In one embodiment, the connection of the first plug element to the circuit board is a soldered connection.

In one embodiment, the first plug element is connected to the circuit board with solder pads located on corners of the plug element.

Another embodiment is distinguished in that electrical connections of contacts in the first plug element to conductor paths and/or other electrical contacts on the circuit board are soldered connections.

The circuit board may include a dielectric carrier, which has a first broadside and a second broadside, wherein the first broadside has a structured metal layer forming conductor paths and functional metallic surfaces, and wherein the second broadside has a structured second metal layer forming conductor paths and functional metallic surfaces.

The dielectric carrier may be made of a single layer comprising dielectric material.

Another embodiment is distinguished in that the dielectric carrier contains at least two layers comprised of dielectric material. It is also preferred that a structured metallic layer forming conductor paths and/or functional surfaces is located between two layers made of dielectric material.

The control unit has a housing that delimits an interior space of the control unit, and the circuit board is place in the housing such that the circuit board divides the interior into a first interior region delimited by the first side and a second interior region delimited by the second side.

Solder pads are located on the first side of the circuit board to which first contacts are soldered, wherein the first contacts are SMD solder connections that do not pass through the circuit board, and that the control unit contains an electrically insulated pin mount in which segments of the first contacts are embedded.

In another embodiment the electrically insulated pin mount bears on the inner surface of the control unit housing.

The electrically insulating pin mount may be made of an electrically insulating and mechanically inherently stable plastic.

The electrically insulating pin mount may include a positioning cylinder which fits precisely into a complementary recess in the circuit board.

In another embodiment there is at least one spacer on the second side of the circuit board opposite the region in the first circuit board on which the first contacts are located, which is configured through its shape and placement to limit a bending of the circuit board when the first plug element and the second plug element are joined together.

Further advantages can be derived from the following description, the drawings, and the dependent claims. It should be understood that the features specified above and explained below can be implemented not only in the respective specified combinations, but also in other combinations or in and of themselves, without abandoning the scope of the present invention.

BRIEF DESCRIPTION OF THE DRAWINGS

Other advantages of the invention will be readily appreciated as the same becomes better understood by reference to the following detailed description when considered in connection with the accompanying drawings, wherein:

FIG. 5 shows a cross section of an exemplary embodiment of a control unit according to the invention.

DETAILED DESCRIPTION OF THE INVENTION

Figure 1:
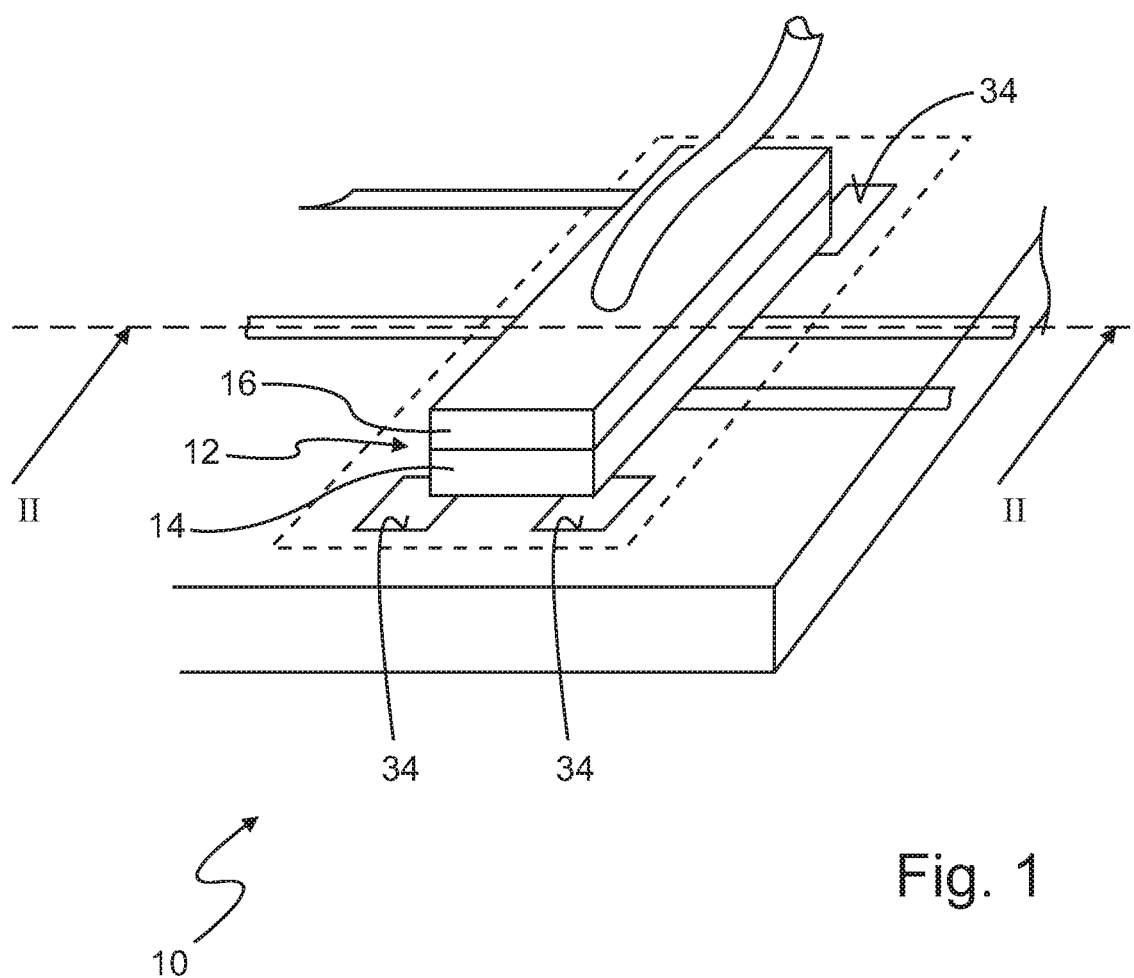
FIG. 1 shows a perspective view of a circuit board with a plug connection.

In detail, FIG. 1 shows a circuit board 10 with a plug connection 12 comprising a first plug element 14 and a second plug element 16. The circuit board 10 has a first side 22 populated with first components 18 and containing conductor paths 20.

The first plug element 14 is securely mechanically connected to the first side 22 of the circuit board 10 in a contact and attachment region 26 (cf. FIG. 2) of the first side 22.

The first plug element 14 has first electrical contacts 24, which are electrically conductively connected to at least one of the first components 18 by metallic structures 28 on or inside the circuit board 10. The metallic structures 28 are, e.g., conductor paths 20 on the first side 22, conductor paths running on the second side 38 of the circuit board 10 that are connected to metallic structures on the first side 22 by metallic through contacts, or metallic structures 30 such as conductor paths running in the circuit board 10, which are electrically conductively connected through contacts to the first side 22.

The first plug element 14 is securely mechanically connected to the second plug element 16. The second plug element 16 is connected to a cable harness 32 in the example shown therein, with which the circuit board 10 can be connected, for example, to a motor vehicle electrical system. The first plug element 14 is preferably securely mechanically connected to the circuit board 10 in the form of an SMD component. The connection is preferably obtained through soldering.

Figure 2:
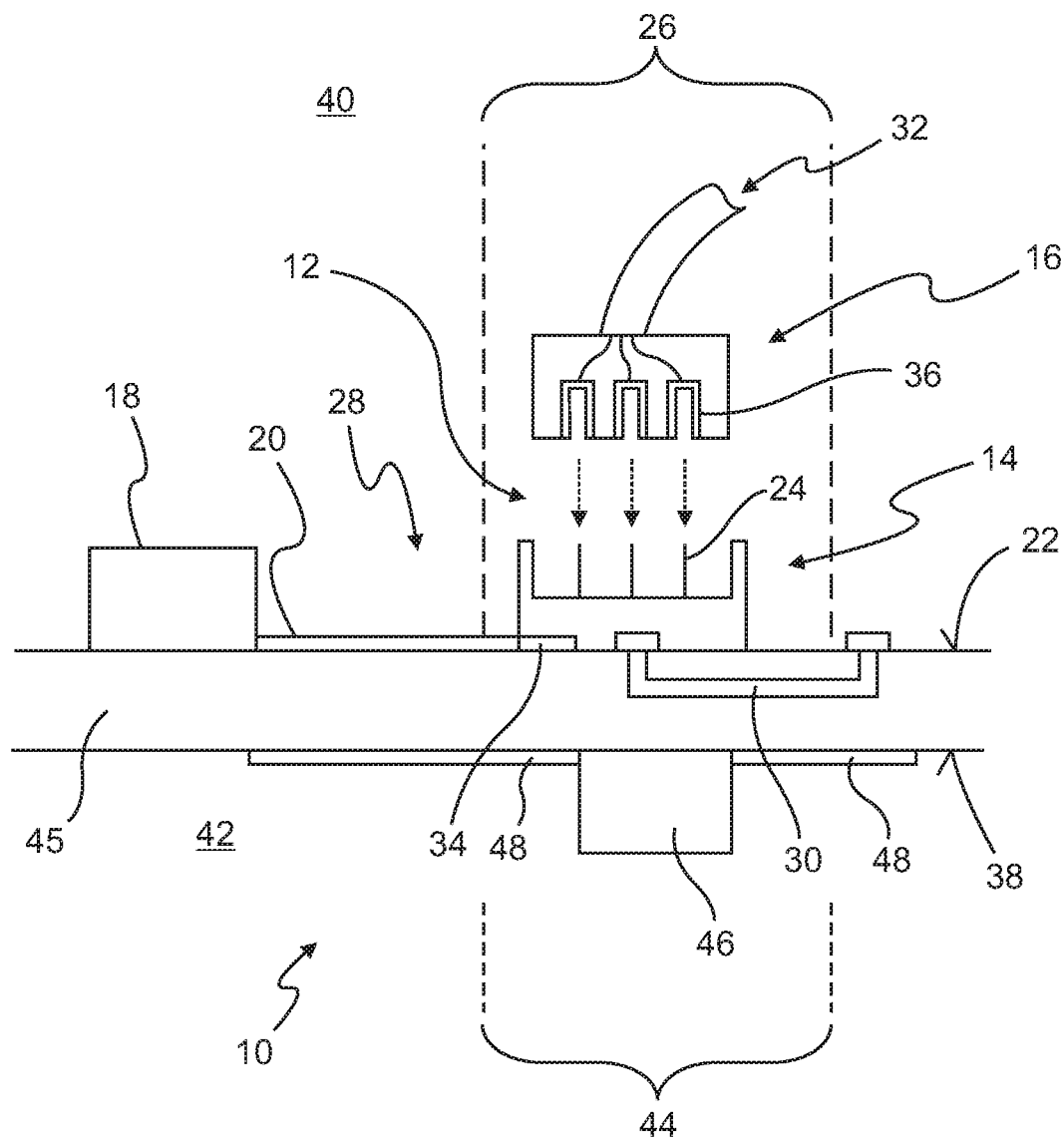
FIG. 2 shows a cross section through the subject matter of FIG. 1.

FIG. 2 shows a cross section through the subject matter of FIG. 1. In detail, FIG. 2 shows the circuit board 10 with a plug connection 12 comprising the first plug element 14 and the second plug element 16. As FIG. 1 shows, the first plug element 14 is connected to the circuit board with solder pads 34 located on the corners of the first plug element 14. Electrical connections of the first electrical contacts 24 of the first plug element 14 to conductor paths and/or other electrical contacts on the circuit board 10 are likewise preferably soldered.

The first plug element 14 is securely mechanically connected to the first side 22 of the circuit board 10 in the contact and attachment region 26 of the first side 22. The first plug element 14 has first electrical contacts 24 that are electrically conductively connected to at least one of the first components 18 through metallic structures 28, 30 running on or in the circuit board 10. The first plug element 14 is securely mechanically connected to the second plug element 16.

The second plug element 16 has second electrical contacts 36, which are then electrically conductively connected to the first electrical contacts 24 when the first plug element 14 is securely mechanically connected to the second plug element 16.

The electrical connection of the second plug element 16 to the first plug element 14 lies entirely within a first interior region 40 of a housing for the control unit, not shown in FIG. 1, which receives and substantially encompasses the circuit board, that is delimited by the first side 22 of the circuit board 10. The first interior region 40 is an interior region located above the circuit board in FIG. 1.

The circuit board 10 also has a second side 38 in addition to the first side 22 populated with components 18 and containing conductor paths 20. A second interior region 42 lies below the circuit board 10 in FIG. 1. This second interior region 42 is delimited at the top by the second side 38 of the circuit board 10 and at the bottom and sides by the housing, not shown in FIG. 1. The first interior region 40 is separated from the second interior region 42 by the circuit board 10.

The second side 38 of the circuit board 10 has a contact and attachment region 44 lying opposite the contact and attachment region 26 of the first side 22, in which second electrical components 46 are located and/or in which conductor paths 48 run.

The circuit board 10 has a dielectric carrier 45, which has a first broadside in the form of the first side 22 and a second broadside in the form of the second side 38. The first broadside has a metal layer structured in the form of conductor paths 20 and functional metallic surfaces. The second broadside likewise has a second metal layer structured in the form of conductor paths 48 and functional metallic surfaces. The dielectric carrier 45 comprises a single layer made of dielectric material in one embodiment, but it can also contain multiple layers comprising at least two layers made of a dielectric material. A metallic layer comprising metallic structures 30 (e.g. conductor paths) and/or functional surfaces can be placed between two such layers made of a dielectric material.

Figure 3:
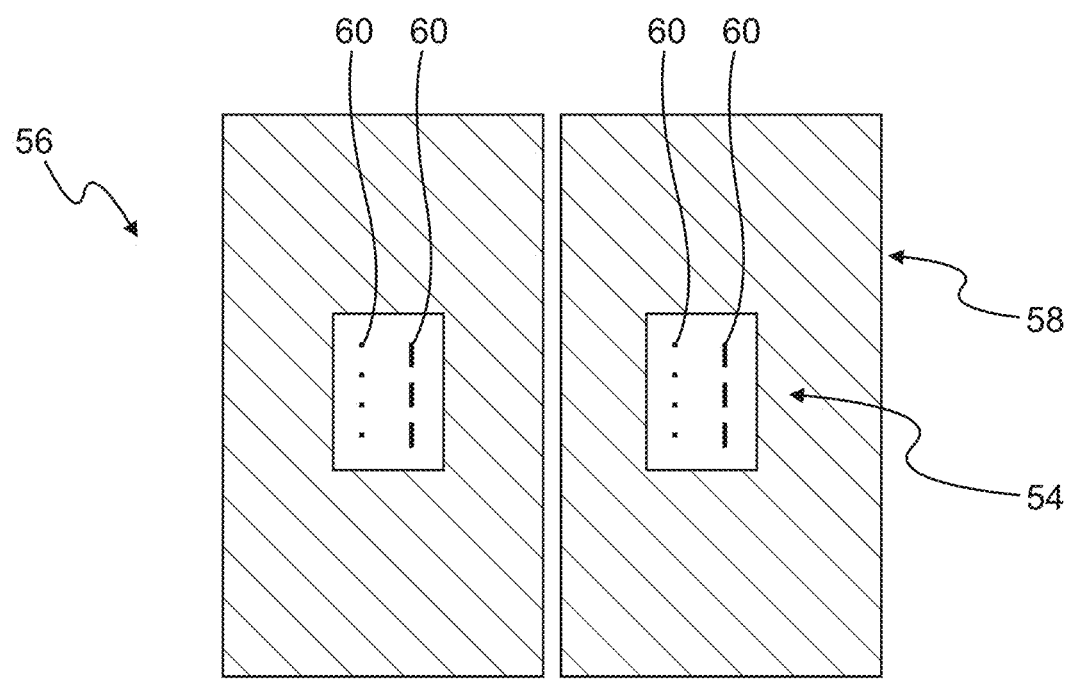
FIG. 3 shows two sides of a circuit board in a known control unit, separated into different regions.
Figure 4:
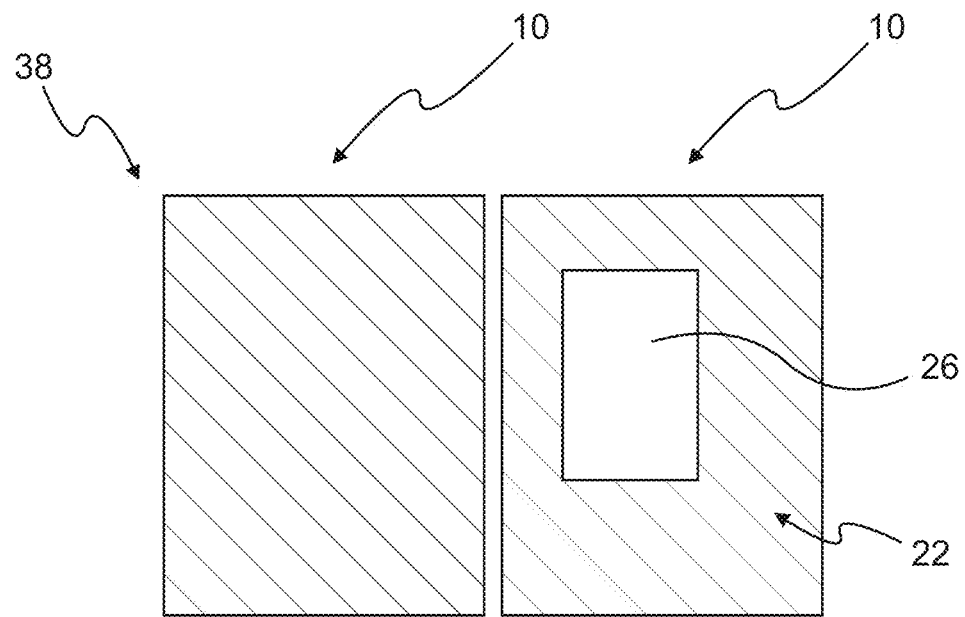
FIG. 4 shows two sides of a circuit board in a known control unit, separated into different regions.

FIGS. 3 and 4 illustrate the advantage of the circuit board 10 according to the invention with respect to the prior art specified in the introduction. In both FIGS. 3 and 4, the shaded region is a region that can be populated with components and used for establishing contact therewith, and the internal rectangle that is not shaded is used for establishing contact to the circuit board 10 on the whole, e.g. through a cable harness.

FIG. 3 shows a known circuit board with a "press-fit" connection in a contact and attachment region 54. The left-hand part of FIG. 3 shows a first side 56 of the known circuit board, and the right-hand part of the figure shows a second side 58 of the circuit board. With the press-fit connection, contact pins 60 or contact tongues in the contact and attachment region 54 extend from both sides of the circuit board, although a plug element is only contacted on one of the two sides, e.g. the first side 56. The first side is the side 56 on the left in FIG. 3, for example.

The connection region 54 lying opposite the first side (left) on the second side (right) cannot be used for components and/or conductor paths due to the functionless contact pins or contact tongues 60 protruding therefrom. The same applies analogously for the prior art according to U.S. Pat. No. 4,826,442, in which "integral solder tails 58" pass through the entire thickness of a circuit board.

In EP 2 928 022 A1 there is also a region on both sides of a circuit board that is not available for components or contacts thereto. With the subject matter of this document, this is due to the fact that a plug element is attached to one side of the circuit board, and the plug connection takes place from the other side of the circuit board through a hole in the circuit board.

FIG. 4 shows both sides of a circuit board 10 in a control unit according to the invention. This differs from the circuit board in FIG. 3 in that the entire second side 38 is available for electrical components and the contacts thereto. The contact to the circuit board 10 takes place in a contact and attachment region 26 on the first side 22 of the circuit board 10. The region of the second side of the circuit board 10 lying opposite this contact and attachment region 26 can be populated with components and their contacts, because the electrical connection of the second plug element to the first plug element lies entirely within a first interior region delimited by the first side of the circuit board, which is separated by the circuit board from a second interior region delimited by the second side. The sum of the shaded regions in FIG. 4 is greater than the sum of the shaded regions in FIG. 3, such that better use can be made of the surface area of the circuit board in FIG. 4, i.e. the circuit board according to the invention can be smaller than known circuit boards while still maintaining the same range of functions and accommodating the same number of the same components.

FIG. 5 shows a cross section through an exemplary embodiment of a control unit 100 according to the invention. The cutting plane is perpendicular to the plane in which the first side 22 and the second side 38 of the circuit board extend. The control unit 100 has a housing 102 that delimits an interior space 104 of the control unit 100. The circuit board 10 divides the interior space 104 into a first interior region 40 delimited by the first side 22 and a second interior region 42 delimited by the second side 38. There are solder pads 34 on the first side 22 of the circuit board 10, to which first contacts 24 are soldered. The first contacts 24 do not pass through the circuit board 10 in the form of SMD solder contacts.

This advantageous space-saving arrangement of the first contacts 24 on the second side 38 of the circuit board 10 has the disadvantage that the connection of the first contacts 24 with their solder pads 34 has a mechanical stability that is lower than the mechanical stability of the connection of the contacts passing through the circuit board with their solder pads in the prior art.

In order to release this connection, a force acts in the positive z-direction on the first contacts 24. The positive z-direction is perpendicular to the first side 22 of the circuit board 10, directed away therefrom, for example.

If the contacts 24 implemented as SMD pins were only attached to the conductor paths, they could become released when the second plug element 16 is pulled out, and cause tears in sections of the conductor paths. The conductor paths can already separate from the circuit board with the application of very low tensile forces. The low mechanical stability could then result in releasing the first contacts 24 when a second plug element 16 is pulled out of a first plug element 14 in a plug connection 12.

A release of the first contacts 24 from the solder pads 34 that is to be avoided, or at least an impairment of the electrical connection between the solder pads 34 and the first contacts 24, can also take place when connecting the second plug element 16 to the first plug element 14. When connecting, a force acts on the circuit board 10 in the negative z-direction. As a result, a circuit board 10 that is connected to the housing 102 with supports 106 that are spaced far apart may bend in the central part of the circuit board 10 lying between the supports 106, resulting in mechanical damage to the connection between the solder pads 34 and the first contacts 24, compromising the electrical conductivity of this connection.

These potential problems are avoided with the preferred embodiments of the control unit 100, which shall be explained in the following: in order to reduce the loads to the connections between the first contacts 24 and solder pads 34 when releasing the plug connection 12, the first contacts 24 are held together with an electrically insulating pin mount 108.

In order to absorb the forces that occur when releasing the plug connection 12, and prevent a deformation of the circuit board 10 in the positive z-direction, the electrically insulating pin mount 108 is designed such that it bears on the inner surface 110 of the control unit housing 102. This ensures that the second plug element 16 can be unplugged from the first contacts 24 of the first plug element 14 without subjecting the SMD contacts to the solder pads 34 to unacceptably high forces. The electrically insulating pin mount 108 is made of an electrically insulating and mechanically inherently stable plastic. A segment of the first contacts 24 is securely embedded in the material of the pin mount 108. The embedding takes place, for example, through a partial coating of the contacts 24 in an injection molding of the pin mount 108. The first contacts 24 are thus joined to the pin mount 108 such that forces acting on the first contacts 24 in the z-direction are transferred to the pin mount 108.

In order to position the first contacts 24, the electrically insulating pin mount 108 has a positioning cylinder 112 that fits precisely in a complementary recess in the circuit board 10. The positioning cylinder 112 preferably extends into the circuit board 10, but not through it. The positioning cylinder 112 is preferably not snapped in place. The recess can be a hole through the circuit board 10, or it can be in the form of a blind hole.

There is preferably at least one spacer 114 in the control unit housing 102 on the second side 38 of the circuit board 10, opposite the contact and attachment region 26 on the first side 22, on which the first contacts 24 are located. The spacer(s) 114 are used to limit a bending of the circuit board 10 in the negative z-direction, counter to the positive z-direction. Such a bending may occur in particular when joining the first plug element 14 with the second plug element 16. The positioning of the spacers 114 and the arrangement of the conductor paths 48 running on the second side 38 of the circuit board 10 must be coordinated to one another. On the whole, there are degrees of freedom for the arrangement of conductor paths 48 and components 46 that did not exist in the prior art specified in the introduction. With plug connections that form contacts as they are used in the prior art specified in the introduction, support from the second side of the circuit board is more difficult to obtain. In one embodiment, the spacers are a component of the housing 102. In another embodiment, there is an alternative or additional spacer that is a component of the circuit board 10.

The invention has been described in an illustrative manner. It is to be understood that the terminology which has been used is intended to be in the nature of words of description rather than of limitation. Many modifications and variations of the invention are possible in light of the above teachings. Therefore, within the scope of the appended claims, the invention may be practiced other than as specifically described.

The invention claimed is:

1. A control unit with a circuit board that has a first plug element, which is configured to be joined with a second plug element to form a plug connection, wherein the circuit board has a first side populated with first components and containing conductor paths, and a second side, and wherein the first plug element is securely mechanically connected to the first side of the circuit board in a contact and attachment region of the first side and contains first electrical contacts that are electrically conductively connected to at least one of the first components through metallic structures running on or in the circuit board, and wherein the first plug element is securely mechanically connected to the second plug element, wherein electrical contacts in the first plug element configured to produce a plug connection that is disposed entirely within a first interior region of the control unit delimited by the first side of the circuit board, which is separated by the circuit board from a second interior region of the control unit delimited by the second side, and in that the second side has a contact and attachment region lying opposite the contact and attachment region on the first side, in which second electrical components are located and/or in which conductor paths run, the control unit has a housing that delimits an interior space of the control unit, and wherein the circuit board is placed in the housing such that the circuit board divides the interior space into a first interior region delimited by the first side and a second interior region delimited by the second side, wherein solder pads are located on the first side of the circuit board, to which first contacts are soldered, wherein the first contacts are SMD solder contacts that do not pass through the circuit board, and in that the control unit contains an electrically insulating pin mount in which segments of the first contacts are embedded, and wherein the electrically insulating pin mount bears on the inner surface of the control unit housing.

2. The control unit as set forth in claim 1, wherein the first plug element is preferably securely mechanically connected as an SMD component to the circuit board.

3. The control unit as set forth in claim 1, wherein the connection of the first plug element to the circuit board is a solder connection.

4. The control unit as set forth in claim 3, wherein the first plug element is connected to the circuit board with solder pads located on corners of the plug element.

5. The control unit as set forth in claim 1, wherein electrical connections of contacts in the first plug element to conductor paths and/or other electrical contacts in the circuit board are soldered connections.

6. The control unit as set forth in claim 1, wherein the circuit board has a dielectric carrier with a first broadside and a second broadside, wherein the first broadside has a metal layer structured in the form of conductor paths and metallic functional surfaces, and wherein the second broadside has a second metal layer structured in the form of conductor paths and metallic functional surfaces.

7. The control unit as set forth in claim 6, wherein the dielectric carrier is comprises a single layer made of dielectric material.

8. The control unit as set forth in claim 6, wherein the dielectric carrier comprises at least two layers made of dielectric material.

9. The control unit as set forth in claim 8, wherein a metallic layer structured with metallic structures and/or functional surfaces is located between two layers made of dielectric material.

10. The control unit as set forth in claim 1, wherein the electrically insulating pin mount is made of an electrically insulating and mechanically inherently stable plastic.

11. The control unit as set forth in claim 1, wherein the electrically insulating pin mount contains a positioning cylinder that fits precisely into a complementary recess in the circuit board.

12. The control unit as set forth in claim 1, wherein there is at least one spacer on the second side of the circuit board opposite the region of the circuit board on which the first contacts are located, which is configured through its shape and placement to limit a bending of the circuit board when joining the first plug element and the second plug element.

* * * * *